United States Patent
Tsutsumi et al.

(10) Patent No.: US 9,819,157 B2
(45) Date of Patent: Nov. 14, 2017

(54) RAIL ATTACHMENT APPARATUS FOR ELECTRICAL DEVICE

(71) Applicant: FUJI ELECTRIC FA COMPONENTS & SYSTEMS CO., LTD., Tokyo (JP)

(72) Inventors: Takashi Tsutsumi, Kounosu (JP); Masaaki Watanabe, Kounosu (JP); Hideki Daijima, Kounosu (JP); Shota Shiinoki, Kounosu (JP); Takashi Shizuka, Gyoda (JP)

(73) Assignee: FUJI ELECTRIC FA COMPONENTS & SYSTEMS CO., LTD., Tokyo (JP)

( * ) Notice: Subject to any disclaimer, the term of this patent is extended or adjusted under 35 U.S.C. 154(b) by 0 days.

(21) Appl. No.: 15/159,272

(22) Filed: May 19, 2016

(65) Prior Publication Data

US 2016/0268081 A1    Sep. 15, 2016

Related U.S. Application Data

(63) Continuation of application No. PCT/JP2015/001947, filed on Apr. 7, 2015.

(30) Foreign Application Priority Data

May 20, 2014    (JP) ................. 2014-104749

(51) Int. Cl.
*H02B 1/052*    (2006.01)
*H05K 7/14*    (2006.01)
(Continued)

(52) U.S. Cl.
CPC ............. *H02B 1/0523* (2013.01); *F16B 2/22* (2013.01); *H01H 50/04* (2013.01);
(Continued)

(58) Field of Classification Search
CPC .... H02B 1/052; H02B 1/0523; H02B 1/0526; H05K 7/1474; H05K 7/12; H01R 9/2608; H01H 50/04; F16B 2/22
(Continued)

(56) References Cited

U.S. PATENT DOCUMENTS

| 4,921,445 | A | * | 5/1990 | Herbert | ................. | H02B 1/052 |
| | | | | | | 439/532 |
| 5,598,322 | A | * | 1/1997 | Von Arx | ................ | H02B 1/052 |
| | | | | | | 361/704 |

(Continued)

FOREIGN PATENT DOCUMENTS

| CH | EP 1833132 A1 * | 9/2007 | ............ H02B 1/052 |
| CN | 102640371 A | 8/2012 | |

(Continued)

OTHER PUBLICATIONS

PCT, "International Search Report for International Application No. PCT/JP2015/001947".

(Continued)

*Primary Examiner* — Eret McNichols
(74) *Attorney, Agent, or Firm* — Manabu Kanesaka

(57) ABSTRACT

There is provided a rail attachment apparatus for an electrical device in which a biasing elastic function is imparted to a slider itself, whereby the slider can be adjusted to be thin and the number of components can be decreased. The rail attachment apparatus includes a nipping portion that nips one side edge of an attaching rail fixed to an attaching surface of the electrical device, and a slider that is opposed to the nipping portion and slidably held at the other side edge of the attaching rail in a direction intersecting with this attaching rail. The slider is provided with integrally formed bending elastic portions which bias the slider in a direction to enable nipping the attaching rail.

9 Claims, 6 Drawing Sheets

(51) Int. Cl.
*H01R 9/26* (2006.01)
*H01H 50/04* (2006.01)
*H05K 7/12* (2006.01)
*F16B 2/22* (2006.01)

(52) U.S. Cl.
CPC .......... *H01R 9/2608* (2013.01); *H02B 1/052* (2013.01); *H02B 1/0526* (2013.01); *H05K 7/12* (2013.01); *H05K 7/1474* (2013.01)

(58) Field of Classification Search
USPC ..... 248/229.26, 229.22, 227.2, 227.4, 298.1; 439/716, 94, 953, 532
See application file for complete search history.

(56) References Cited

U.S. PATENT DOCUMENTS

| | | | | |
|---|---|---|---|---|
| 5,904,592 | A * | 5/1999 | Baran | H02B 1/052 361/627 |
| 6,120,000 | A * | 9/2000 | Aeschbach | H01R 9/2608 248/220.21 |
| 6,371,435 | B1 * | 4/2002 | Landis | H02B 1/052 248/694 |
| 6,563,697 | B1 * | 5/2003 | Simbeck | H02B 1/052 200/295 |
| 6,563,710 | B1 * | 5/2003 | Okuda | H05K 7/20918 361/600 |
| 7,059,898 | B2 * | 6/2006 | Barile | H02B 1/052 439/532 |
| 7,374,453 | B1 * | 5/2008 | Allcock | B66C 7/08 439/532 |
| 7,522,428 | B2 * | 4/2009 | Nguyen | H02B 1/052 361/759 |
| 7,980,891 | B2 * | 7/2011 | Molnar | H01R 9/2608 361/735 |
| 8,062,061 | B2 * | 11/2011 | Lim | H02B 1/052 439/532 |
| 9,331,404 | B2 * | 5/2016 | Devanand | H01R 9/2608 |
| 9,337,637 | B2 * | 5/2016 | Neumeier | H02B 1/0526 |
| 2005/0006053 | A1 * | 1/2005 | Apfelbacher | H02B 1/56 165/80.2 |
| 2008/0299820 | A1 * | 12/2008 | Schelonka | H01R 9/2608 439/532 |
| 2010/0128448 | A1 * | 5/2010 | WenLong | H02B 1/052 361/747 |
| 2010/0314522 | A1 * | 12/2010 | Molnar | H02B 1/052 248/346.06 |
| 2012/0138759 | A1 * | 6/2012 | Takaya | H02B 1/052 248/225.21 |
| 2012/0298821 | A1 | 11/2012 | Hofbauer | |
| 2013/0214109 | A1 * | 8/2013 | Yu | H02B 1/0526 248/298.1 |
| 2014/0139976 | A1 * | 5/2014 | Santoni | F16B 1/00 361/605 |
| 2014/0226287 | A1 * | 8/2014 | V | H02B 1/052 361/747 |
| 2016/0327764 | A1 * | 11/2016 | Shi | F16B 2/185 |

FOREIGN PATENT DOCUMENTS

| | | | | |
|---|---|---|---|---|
| DE | 2631871 A1 | * | 2/1977 | ............ H02B 1/052 |
| DE | 9103971 U1 | * | 6/1991 | ............ H02B 1/052 |
| DE | 29506579 U1 | * | 6/1995 | ............ H02B 1/052 |
| DE | 19537528 A1 | * | 4/1997 | .......... H01R 9/2608 |
| DE | WO 02060026 A1 | * | 8/2002 | ............ H02B 1/052 |
| DE | 10027455 B4 | * | 10/2008 | ............ H02B 1/052 |
| DE | 102011010828 A1 | * | 8/2012 | ............ H02B 1/052 |
| DE | EP 2582000 A1 | * | 4/2013 | ............ H02B 1/052 |
| DE | 202015106673 U1 | * | 1/2016 | .......... H01R 9/2608 |
| FR | DE4117465 A1 | * | 12/1991 | ............ H02B 1/052 |
| FR | 2666482 A1 | * | 3/1992 | ............ H02B 1/052 |
| IT | EP 2020718 A1 | * | 2/2009 | ............ H02B 1/052 |
| JP | S61-26226 U | | 2/1986 | |
| JP | S61-172438 U | | 10/1986 | |
| JP | 02163993 A | * | 6/1990 | |
| JP | H03-64428 U | | 6/1991 | |
| JP | H06-139893 A | | 4/1994 | |
| JP | H06-038166 U | | 5/1994 | |
| JP | 11233969 A | * | 8/1999 | |
| JP | 2007189102 A | * | 7/2007 | |
| JP | 2011-044285 A | | 3/2011 | |
| JP | 4844911 B1 | * | 12/2011 | .......... H02B 1/0523 |
| JP | 2013102142 A | * | 5/2013 | .......... H05K 7/1474 |
| JP | DE 102012219115 A1 | * | 10/2013 | .......... H02B 1/0526 |
| JP | 6003506 B2 | * | 10/2016 | .......... H05K 7/1474 |
| SE | WO 9731412 A1 | * | 8/1997 | ............ H02B 1/052 |

OTHER PUBLICATIONS

PCT/ISA/237, "Written Opinion of the International Searching Authority for International Application No. PCT/JP2015/001947," dated Jun. 30, 2015.

PCT/IB/338, "Notification of Transmittal of Translation of the International Preliminary Report on Patentability for International Application No. PCT/JP2015/001947," dated Dec. 1, 2016.

PCT/IB/373, "International Preliminary Report on Patentability for International Application No. PCT/JP2015/001947," dated Nov. 22, 2016.

China Patent Office, "Office Action for Chinese Patent Application No. 201580002790.X," dated Apr. 1, 2017.

* cited by examiner

RAIL ATTACHMENT APPARATUS FOR ELECTRICAL DEVICE

CROSS-REFERENCE TO RELATED APPLICATION

This is a continuation application of PCT International Application No. PCT/JP2015/001947 filed on Apr. 7, 2015, which claims a priority of Japanese Patent Application No. 2014-104749 filed on May 205, 2014.

TECHNICAL FIELD

The present invention relates to a rail attachment apparatus for an electrical device in which the electrical device including an electromagnetic contactor and the like is attachable to and detachable from an attaching rail.

BACKGROUND ART

As this type of rail attachment apparatus for an electrical device, for example, rail attachment apparatuses described in Patent Literatures 1 and 2 have been suggested.

A conventional example described in Patent Literature 1 comprises a slider which includes a coil spring disposed on a rear side of a frame of an electromagnetic contactor and is biased toward a rail side, and a support column having a hook portion at its tip is disposed adjacent to a rail on an inner bottom surface of a case, this hook portion being engaged in a hook hole of the slider.

A conventional example described in Patent Literature 2 comprises a first engaging portion and a second engaging portion opposed to engage with both side edges of a rail, and a wire spring which presses the side edge of the rail engaged with the first engaging portion, a spring biasing force of this wire spring being given to the rail so that the other rail edge is pressed by the second engaging portion.

CITATION LIST

Patent Literature
PTL 1: JP H06-139893 A
PTL 2: JP 2011-44285 A

SUMMARY OF INVENTION

Technical Problem

However, in a conventional example described in Patent Literature 1, a coil spring is disposed in a slider, and thus, a thickness of the slider increases and accordingly a height of an electromagnetic contactor also increases. Furthermore, there is also an unsolved problem that the slider and the coil spring have to be disposed as separate members and the number of components increases.

Additionally, a conventional example described in Patent Literature 2 has a constitution in which any sliders are not disposed and a side edge of a rail is pressed by a wire spring, and hence a thickness of a rail attaching portion can be decreased, but on the other hand, there is an unsolved problem that a posture of the wire spring becomes unstable and the pressing of the rail side edge by the wire spring cannot exactly be performed.

Thus, the present invention has been developed in view of the above unsolved problems of the conventional examples, and an object thereof is to provide a rail attachment apparatus for an electrical device in which an biasing elastic function is imparted to a slider itself, whereby the slider can be adjusted to be thin and the number of components can be decreased.

Solution to Problem

To achieve the above object, a rail attachment apparatus for an electrical device according to the present invention includes a nipping portion that nips one side edge of an attaching rail fixed to an attaching surface of the electrical device, and a slider that is opposed to the nipping portion and slidably held at the other side edge of the attaching rail in a direction intersecting with this attaching rail. Further, the slider is provided with integrally formed bending elastic portions which bias the slider in a direction to enable nipping the attaching rail.

Advantageous Effects of Invention

According to the present invention, bending elastic portions are integrally formed in a slider, and hence it is not necessary to separately dispose an elastic member that biases the slider, and it is also not necessary to dispose a coil spring or the like in the slider, whereby a thickness of the slider itself can be decreased and a height of the whole electrical device can be decreased, so that miniaturization can be achieved.

DESCRIPTION OF EMBODIMENTS

One embodiment of the present invention will now be described with reference to the drawings.

Figure 1:
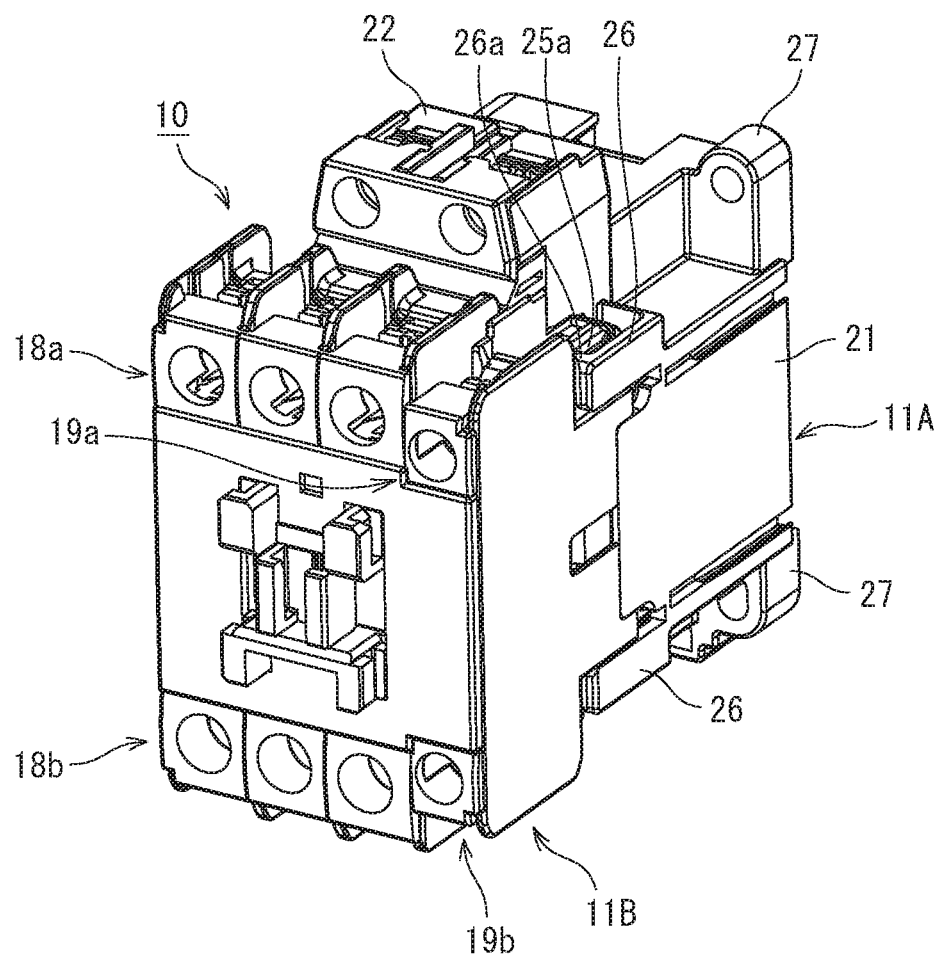
FIG. 1 is an appearance perspective view illustrative of one example where the present invention is applied to an electromagnetic contactor.

An electromagnetic contactor 10 as an electrical device according to the present invention is configured by coupling a first frame 11A and a second frame 11B with each other as illustrated in FIG. 1.

Figure 2:
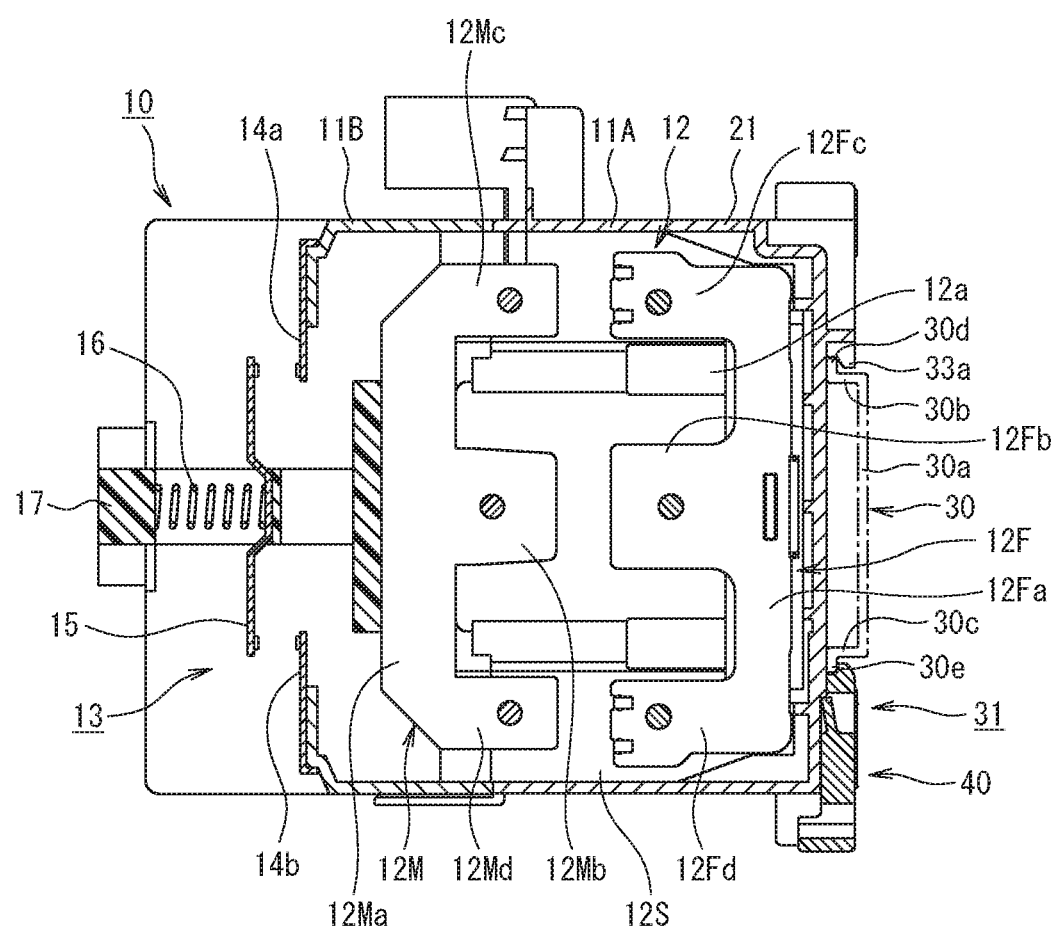
FIG. 2 is a vertical cross-sectional view of FIG. 1.

As illustrated in FIG. 2, an operating electromagnet 12 is disposed in the first frame 11A. In the second frame 11B, as illustrated in FIG. 2, there is disposed a contact mechanism 13 that is driven to be on and off by the operating electromagnet 12.

The contact mechanism 13 includes a pair of fixed contacts 14a and 14b fixed to keep a predetermined distance therebetween, and a contact support 17 supported to be movable in a forward-backward direction so that a movable contact 15 held by a contact spring 16 becomes contactable and separable to these fixed contacts 14a and 14b.

Additionally, in the second frame 11B, as illustrated in FIG. 1, a front end face is provided with a power source side terminal portion 18a and an auxiliary terminal portion 19a which are connected to the fixed contact 14a, and a load side terminal portion 18b and an auxiliary terminal portion 19b which are connected to the fixed contact 14b.

The first frame 11A has a bottomed square tubular portion 21 that contains the operating electromagnet 12. The operating electromagnet 12 is configured of, for example, an AC electromagnet. As illustrated in FIG. 2, the operating electromagnet 12 has a fixed core 12F, a movable core 12M and a spool 12S around which an excitation coil 12a is wound.

The fixed core 12F is integrally formed of a laminated steel plate having a coupling plate portion 12Fa, a central projecting plate portion 12Fb and upper and lower projecting plate portions 12Mc and 12Md, and is formed into an E-shape seen from a left side surface, and the coupling plate portion 12Fa is fixed and supported by a bottom surface of the bottomed square tubular portion 21.

The movable core 12M is integrally formed of a laminated steel plate having a coupling plate portion 12Ma, a central projecting plate portion 12Mb and upper and lower projecting plate portions 12Mc and 12Md, and the movable core is formed into an E-shape seen from a right side surface, and is coupled with the contact support 17 supported to be slidable forward and backward in the second frame 11B so that the movable core is movable forward and backward. Here, the fixed core 12F and the movable core 12M are biased by an unillustrated return spring so that the central projecting plate portion 12Fb and the upper and lower projecting plate portions 12Fc and 12Fd of the fixed core 12F face the central projecting plate portion 12Mb and the upper and lower projecting plate portions 12Mc and 12Md of the movable core 12M to keep a predetermined space therebetween.

The spool 12S is mounted around the central projecting plate portion 12Fb of the fixed core 12F. The spool 12S has a coil terminal 22 that projects upward from, for example, an upper end of the first frame 11A. Therefore, a suction force is not generated in the fixed core 12F in a non-excitation state of the excitation coil 12a in which an AC power is not supplied to the coil terminal 22, but the suction force to suck the movable core 12M against the return spring is generated in the fixed core 12F in an excitation state of the excitation coil 12a in which the AC power is supplied to the coil terminal 22.

Figure 3:
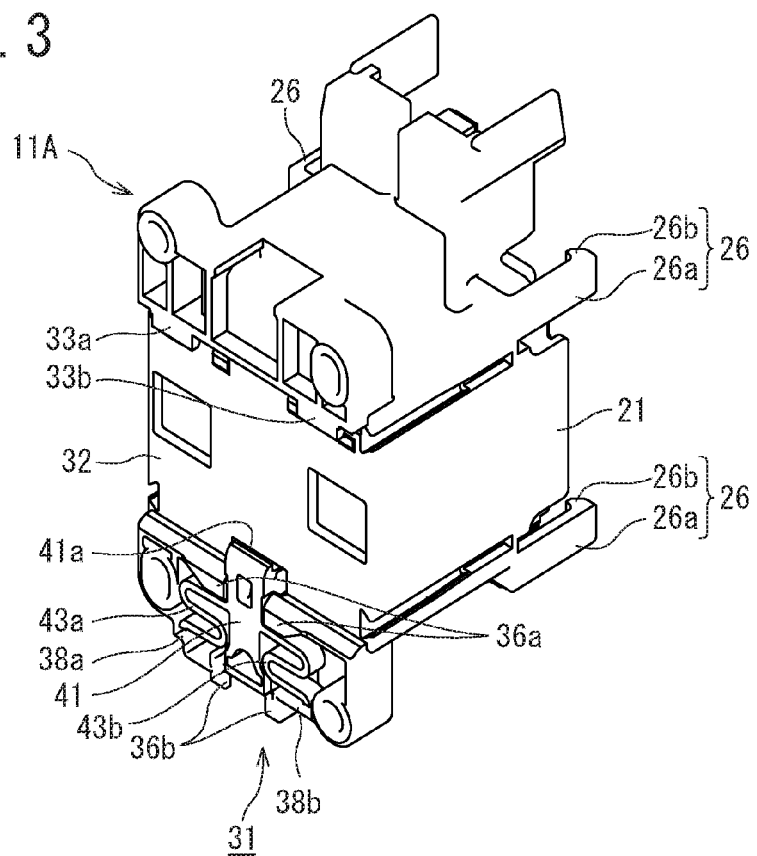
FIG. 3 is a perspective view of a first frame of FIG. 1 seen from an attaching surface side.
Figure 4:
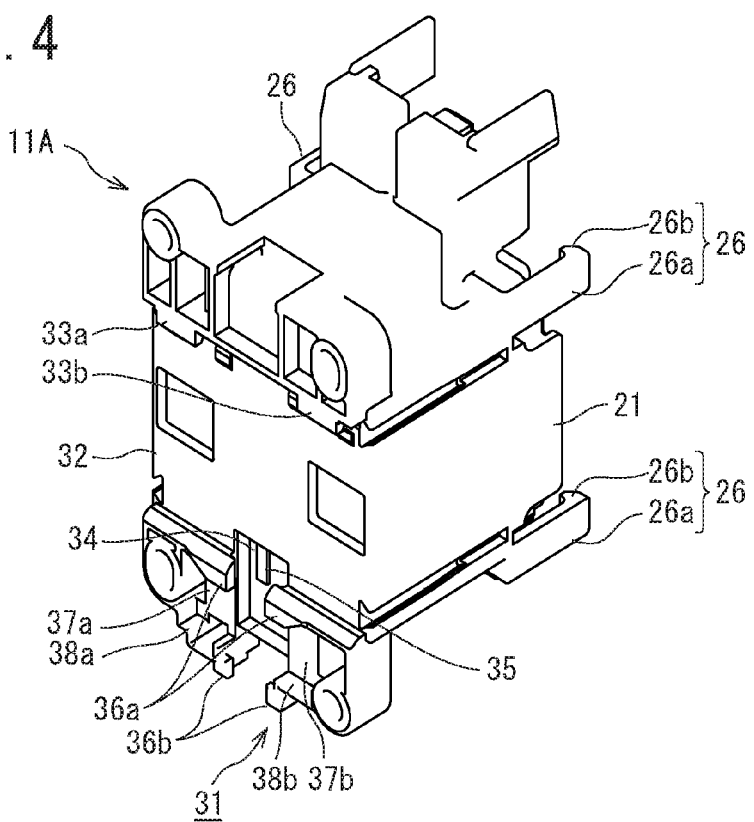
FIG. 4 is a perspective view of a state where a slider of FIG. 3 is removed.

Additionally, at upper and lower positions of the first frame 11A in front end open end faces of right and left side surfaces of the bottomed square tubular portion 21, as illustrated in FIG. 1, FIG. 3 and FIG. 4, there are formed hook portions 26 which extend forward to engage with engaging portions 25 formed in the second frame 11B, thereby constituting snap fit portions, respectively. As illustrated in FIG. 3, each of the hook portions 26 includes a comparatively wide projecting piece 26a that has a flexibility and extends forward from a front end of the bottomed square tubular portion 21, and an engaging portion 26b projected toward a tip inner side of the projecting piece 26a.

Furthermore, attaching plate portions 27 having attaching holes are formed at four corners of a bottom portion of the bottomed square tubular portion 21 of the first frame 11A.

Figure 5:
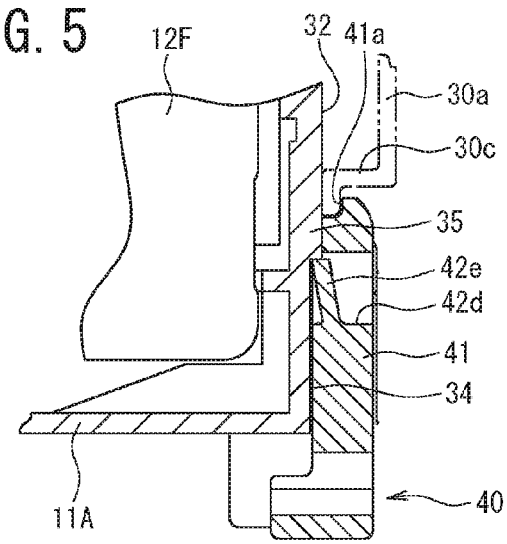
FIG. 5 is an enlarged cross-sectional view of the slider of FIG. 2.

Additionally, in the bottom surface of the bottomed square tubular portion 21 of the first frame 11A which becomes an attaching surface, as illustrated in FIGS. 3 to 5, a rail attachment apparatus 31 is attached to an attaching rail 30 fixed to a wall surface or the like.

As illustrated by a two-dot chain line in FIG. 2, the attaching rail 30 includes an attaching plate portion 30a that extends in a right-left direction, horizontal plate portions 30b and 30c which extend forward from upper and lower end portions of the attaching plate portion 30a, respectively, an upper flange portion 30d that extends upward from a front end of the horizontal plate portion 30b, and a lower flange portion 30e that extends downward from a front end of the horizontal plate portion 30c.

The rail attachment apparatus 31 has a rail mounting concave portion 32 that has a width equal to a width of the attaching rail 30 extended in the right-left direction in the bottom surface of the bottomed square tubular portion 21. Nipping portions 33a and 33b which project and face a bottom surface of the rail mounting concave portion 32 of the bottomed square tubular portion 21 are formed to nip the upper flange portions 30d of the attaching rail 30 which are formed on both right and left end sides in a front end portion of an upper wall surface that forms the rail mounting concave portion 32.

Additionally, at a central position of a lower wall surface that forms the rail mounting concave portion 32, there is formed a slider receiving concave portion 34 that reaches a lower end face of the bottomed square tubular portion 21 from an upper position at as much as a predetermined distance from the lower wall surface of the rail mounting concave portion 32, to intersect with the rail mounting concave portion 32, and the slider receiving concave portion extends at a depth larger than that of the rail mounting concave portion 32 in a vertical direction. As illustrated in FIG. 3, in the slider receiving concave portion 34, a protrusion 35 is projected forward from a central portion in the right-left direction of an upper end side in a bottom portion that becomes a slider attaching surface, and is extended downward as much as a predetermined distance.

In the slider receiving concave portion 34, guide plate portions 36a and 36b, which vertically slidably guide the slider 40 opposed to the nipping portions 33a and 33b, are formed in rear end portions of right and left side wall portions on the upper end side and a lower end side, respectively, to project into the slider receiving concave portion 34. Furthermore, between the guide plate portions 36a and 36b, bending elastic portion receiving spaces 37a and 37b are formed in which bending elastic portions 43a and 43b of the slider 40 which will be described later are received. Lower end side walls which form the bending elastic portion receiving spaces 37a and 37b are defined as engaging portions 38a and 38b which engage with engaging plate portions 44e and 45e of the bending elastic portions 43a and 43b.

As illustrated in FIGS. 8A to 8D, the slider 40 is configured by injection forming of a thermoplastic synthetic resin material such as polyamide (PA) 66, polyphenylene sulfide (PPS) or polytetrafluoroethylene (PTFE). The slider 40 has a main plate portion 41 extending in a direction intersecting with the rail mounting concave portion 32 in which the attaching rail 30 is mounted, and having, at its tip, an engaging portion 41a that engages with the lower flange portion 30e of the attaching rail 30. The main plate portion 41 includes a comparatively wide upper plate portion 42a on the upper end side, an intermediate plate portion 42b that is connected to a lower end of the upper plate portion 42a and has a width smaller than that of the upper plate portion 42a, and a lower plate portion 42c that is connected to a lower end of the intermediate plate portion 42b, has a width larger than that of the upper plate portion 42a, and projects forward.

At a central position of the upper plate portion 42a, there is formed an opening 42d that reaches a front surface from a rear side, and there is formed an elastic engaging projection 42e that projects and extends upward and forward from a front side of a lower end wall surface of the opening 42d. A free end of the elastic engaging projection 42e is projected forward from the front surface of the upper plate portion 42a.

Additionally, in the upper plate portion 42a, guide pieces 42f, which project to the right and left, respectively, are formed on the front side of the upper end side, and in the lower plate portion 42c, guide pieces 42g, which project to the right and left, respectively, are similarly formed on the front side of the lower end side.

Furthermore, at right and left side edges at a connected position of the upper plate portion 42a and the intermediate plate portion 42b, the outwardly projecting bending elastic portions 43a and 43b are integrally formed being outwardly projecting, respectively. Each of the bending elastic portions 43a and 43b is horizontally symmetrically formed. The bending elastic portion 43a is formed into bellows and includes a substrate portion 44a which has, in a left direction from the main plate portion 41, a height substantially equal to a height (e.g., 3 mm) of the main plate portion 41 in the forward-backward direction projecting and extending in a direction orthogonal to a longitudinal direction of the main plate portion 41 and whose thickness is decreased to be about ¼ to ⅕ of the height; a first U-shaped and folded portion 44b that is connected to a left end portion of the substrate portion 44a and folded back substantially in parallel with the substrate portion 44a in the form of a U-shape seen from the front surface; a parallel plate portion 44c that is connected to the first U-shaped and folded portion 44b and is substantially parallel to the substrate portion 44a; a second U-shaped and folded portion 44d that is folded back from a right end portion of the parallel plate portion 44c in the vicinity of a coupled position of the intermediate plate portion 42b with the lower plate portion 42c in parallel with the substrate portion 44a and the parallel plate portion 44c, in the form of a U-shape seen from the front surface; and an engaging plate portion 44e that substantially extends in parallel with the substrate portion 44a and the parallel plate portion 44c in the left direction from the second U-shaped and folded portion 44d.

Similarly, the bending elastic portion 43b is also formed linearly symmetrically with the bending elastic portion 43a, formed into bellows, with a substrate portion 45a, a first U-shaped and folded portion 45b, a parallel plate portion 45c, a second U-shaped and folded portion 45d and an engaging plate portion 45e. Here, a distance between upper surfaces of the substrate portions 44a and 45a of the bending elastic portions 43a and 43b and lower surfaces of the engaging plate portions 44e and 45e is set to be substantially equal to a distance in a vertical direction of the bending elastic portion receiving spaces 37a and 37b formed on both the right and left sides of the slider receiving concave portion 34 of the bottomed square tubular portion 21.

Furthermore, a tool inserting hole 43 that extends through the lower plate portion 42c in the forward-backward direction is formed in the lower plate portion.

Figure 7:
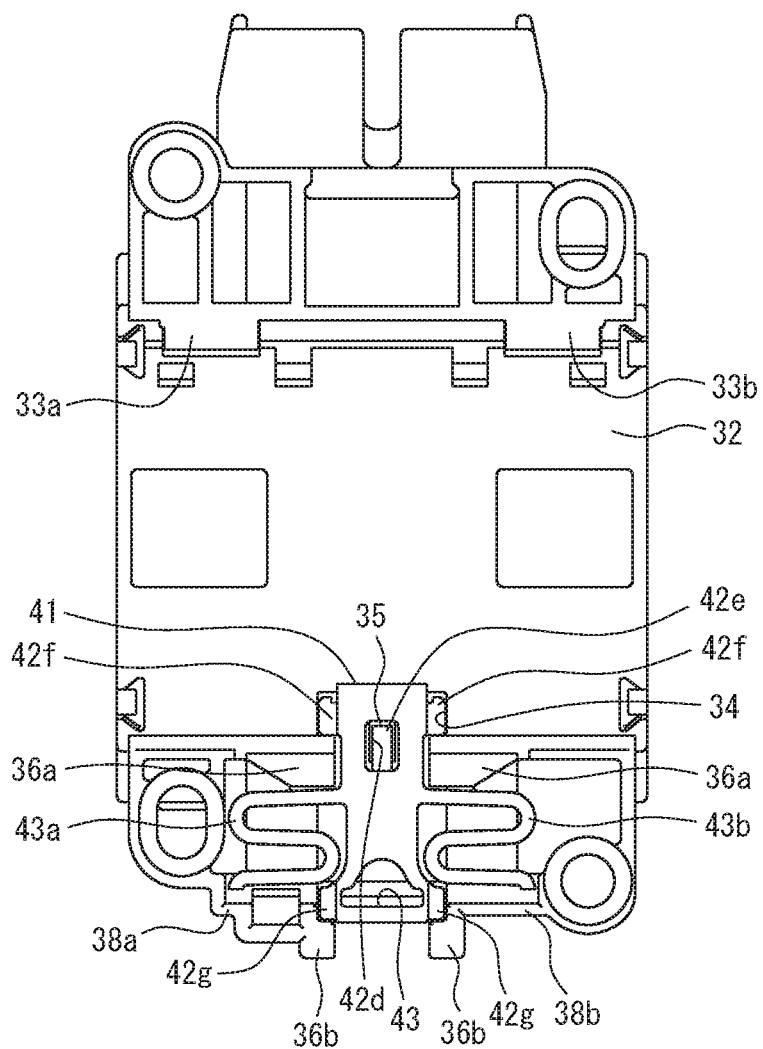
FIG. 7 is a rear view illustrating that the slider of FIG. 1 is attached.
Figure 8A:
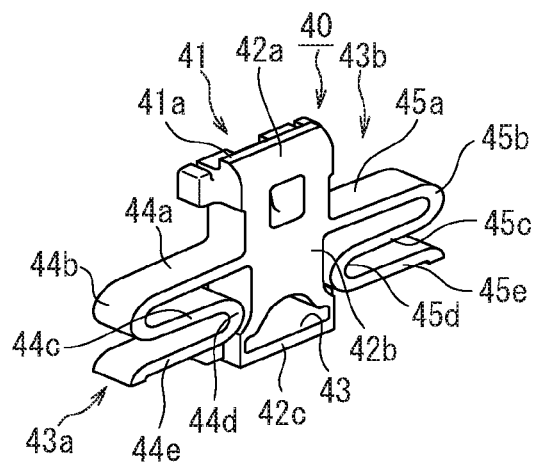
FIGS. 8A to 8D are views illustrative of the slider, FIG. A is a perspective view, FIG. B is a front view, FIG. C is a rear view, and FIG. D is a side view.
Figure 8B:
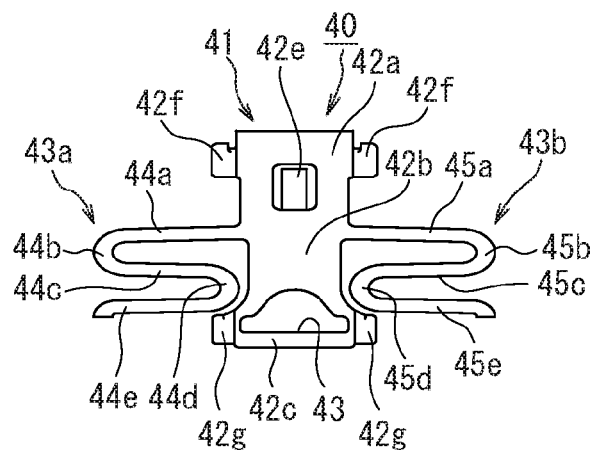
Figure 8C:
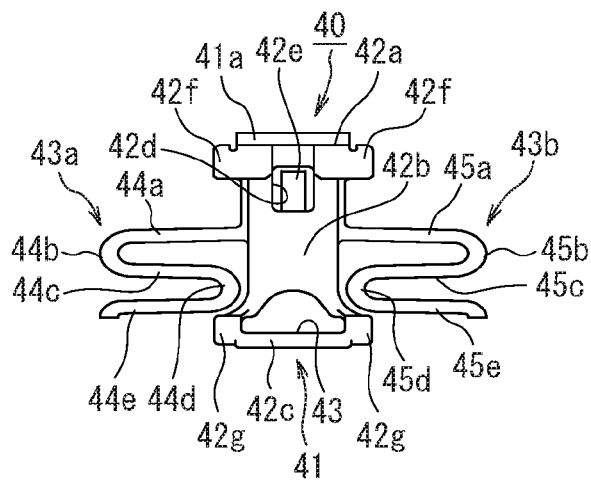
Figure 8D:
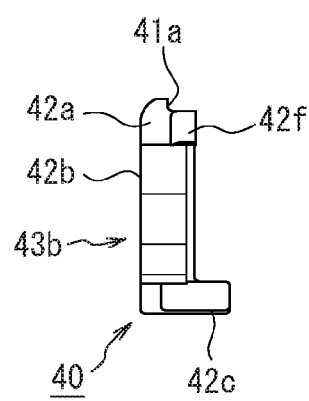

Further, to attach the slider 40 to the bottom surface of the bottomed square tubular portion 21, first, the main plate portion 41 of the slider 40 is received in the slider receiving concave portion 34 as illustrated in FIG. 7. At this time, the elastic engaging projection 42e is brought into contact with the protrusion 35 of the slider receiving concave portion 34, the guide pieces 42f and 42g are brought into contact with the upper end side and lower end side of the bottom portion of the slider receiving concave portion 34, and the bending elastic portions 43a and 43b are received in the bending elastic portion receiving spaces 37a and 37b. Here, the engaging plate portions 44e and 45e of the bending elastic portions 43a and 43b are disposed upward away from the engaging portions 38a and 38b as illustrated in FIG. 7, and the bending elastic portions 43a and 43b are in a free length state where any repulsive force is not generated.

Thus, in a state where the elastic engaging projection 42e is in contact with the surface of the protrusion 35 of the slider receiving concave portion 34, the elastic engaging projection 42e projects from the surface of the main plate portion 41, and hence the guide pieces 42f face the guide plate portion 36a from the upside, and the guide pieces 42g face a lower space of the guide plate portion 36b.

In this state, the slider 40 is pressed toward the bottom surface of the slider receiving concave portion 34 to bend the elastic engaging projection 42e in the opening 42d, whereby the guide pieces 42f face the lower space of the guide plate portion 36a.

Further, when the slider 40 that remains to be pressed toward the bottom surface is slid downwardly, the guide pieces 42f and 42g are interposed between the guide plate portions 36a and 36b and the bottom surface of the slider receiving concave portion 34. Simultaneously, the engaging plate portions 44e and 45e of the bending elastic portions 43a and 43b are engaged with the engaging portions 38a and 38b, whereby portions between the substrate portions 44a and 45a of the bending elastic portions 43a and 43b and the engaging plate portions 44e and 45e bend in a contracting direction, thereby generating the repulsive force to return the slider 40 upward.

Figure 6:
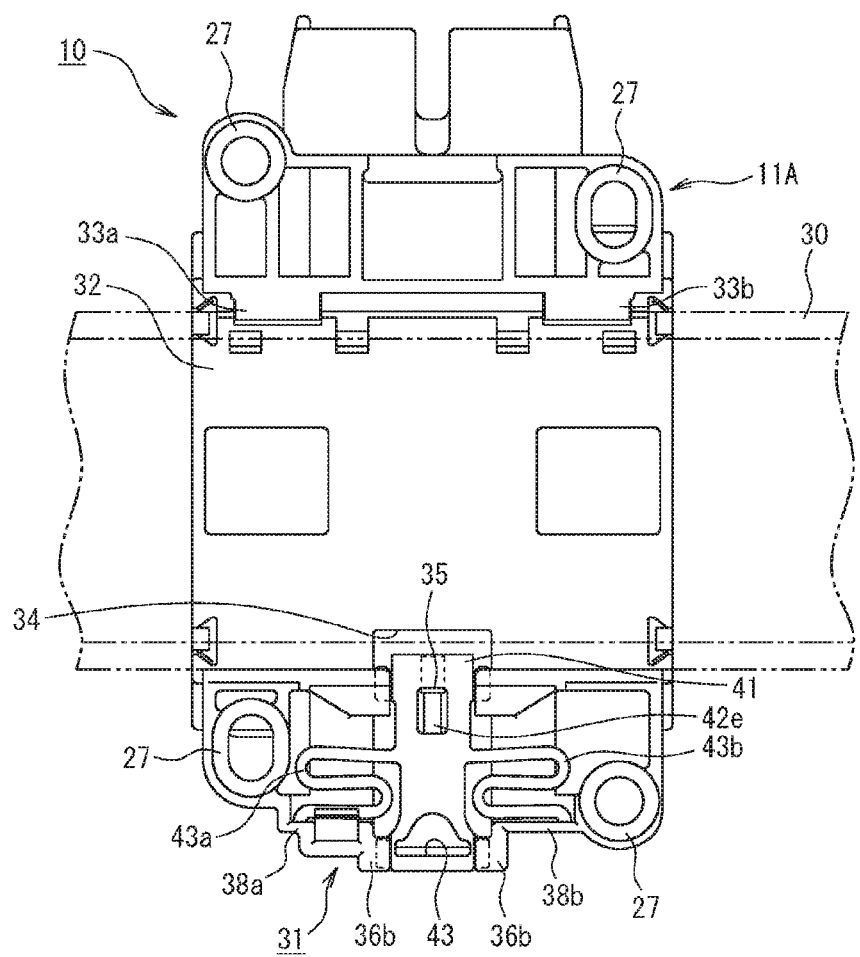
FIG. 6 is a rear view of FIG. 1.

Furthermore, when the slider 40 is slid downward to obtain a state where the elastic engaging projection 42e faces the lower end face of the protrusion 35 as illustrated in FIG. 5, the elastic engaging projection 42e projects toward the front surface to engage with the lower surface of the protrusion due to its own elasticity. When the pressing of the slider 40 is released in this state, the slider 40 is held in the slider receiving concave portion 34 without falling upward or rearward as illustrated in FIG. 6 and FIG. 7.

Next, a rail attaching operation of the above embodiment will be described.

First, as illustrated in FIG. 2, the attaching rail 30 is extended in the right-left direction and fixed to the wall surface or the like.

To support the electromagnetic contactor 10 by the attaching rail 30, first, the nipping portions 33a and 33b of the rail attachment apparatus 31 are hooked to nip the upper flange portion 30d of the attaching rail 30 from the upside.

Next, a minus screwdriver as a tool is inserted from a front surface side into the tool inserting hole 43 of the slider 40 to slide the slider 40 downward against the repulsive force of the bending elastic portions 43a and 43b, and in a state where the engaging portion 41a of the main plate portion 41 is retained to be back on the lower side of the rail mounting concave portion 32 or to be flush with a lower flat surface thereof, a slider 40 side of the electromagnetic contactor 10 is rotated to an attaching rail 30 on a contact point of the nipping portion 33a or 33b with the upper flange portion 30d as a rotation center.

Further, in a state where the bottom surface of the rail mounting concave portion 32 is in contact with the lower flange portion 30e, a force to slide the slider 40 downward is released. In consequence, the slider 40 moves upward by the repulsive force of the bending elastic portions 43a and 43b, to obtain a state where the lower flange portion 30e is nipped by the engaging portion 41a of the main plate portion 41 as illustrated in FIG. 2 and FIG. 5, whereby the electromagnetic contactor 10 is held by the attaching rail 30.

When the electromagnetic contactor 10 is removed from the attaching rail 30 in the held state of the electromagnetic contactor 10 by the attaching rail 30, for example, the minus screwdriver is inserted into the tool inserting hole 43 of the slider 40 to slide the slider 40 downward against the repulsive force of the bending elastic portions 43a and 43b, and the engaging portion 41a is moved to the lower side of the lower flange portion 30e of the attaching rail 30.

In this state, the slider 40 side of the electromagnetic contactor 10 is rotated in a direction away from the attaching rail 30 based on the rotation center of the contact point of the nipping portion 33a or 33b with the upper flange portion 30d of the attaching rail 30, thereby obtaining a state where the engaging portion 41a does not face the lower flange portion 30e. Afterward, a downward sliding force of the slider 40 is released and then the nipping of the upper flange portion 30d of the attaching rail 30 by the nipping portions 33a and 33b is released, so that the electromagnetic contactor 10 can be removed from the attaching rail 30.

In this way, according to the above embodiment, the bending elastic portions 43a and 43b are integrally formed in the slider 40 of the rail attachment apparatus 31, whereby it is not necessary to separately dispose an elastic member that biases the slider 40 toward the attaching rail 30, and accordingly the number of components can be decreased.

Additionally, in the slider 40 made of the thermoplastic synthetic resin material, the main plate portion 41 and the bending elastic portions 43a and 43b are integrally formed, and hence a thickness of the slider can be decreased as compared with a conventional example where a coil spring is disposed or the slider is biased by a wire spring. Consequently, a height of the rail attachment apparatus 31 can be decreased, a height of the whole electromagnetic contactor 10 can be decreased, and miniaturization of the electromagnetic contactor 10 can be achieved.

Furthermore, in the slider 40 made of the thermoplastic synthetic resin material, the main plate portion 41 and the bending elastic portions 43a and 43b are integrally formed, and the bending elastic portions 43a and 43b are formed into the bellows and configured of at least the substrate portions 44a and 45a and the U-shaped and folded portions 44b and 45b. Consequently, heat resisting properties of the bending elastic portions 43a and 43b can improve, and life of the slider 40 can be lengthened by inhibiting permanent set in fatigue. Additionally, the U-shaped and folded portions are formed, whereby a bend amount of the bending elastic portions 43a and 43b when sliding the slider 40 can be dispersed, and a durability can further improve.

It is to be noted that in the above embodiment, there has been described the case where the bending elastic portions 43a and 43b are disposed on both right and left sides of the main plate portion 41, but the present invention is not limited to this embodiment, and one of the bending elastic portions may be omitted and the bending elastic portion may be disposed only on one side of the main plate portion 41.

Additionally, in the above embodiment, there has been described the case where the bending elastic portions 43a and 43b are formed into the bellows and includes the first U-shaped and folded portions 44b and 45b and the second U-shaped and folded portions 44d and 45d, but one or three or more U-shaped and folded portions may be formed.

Furthermore, in the above embodiment, there has been described the case where the present invention is applied to the electromagnetic contactor in which the AC electromagnet is used, but the present invention is not limited to this embodiment, and the present invention is also applicable to an electromagnetic contactor in which a DC electromagnet is used. Furthermore, when an electrical device such as a breaker, a relay or a breaker unit except the electromagnetic contactor is attached to the attaching rail, the rail attachment apparatus according to the present invention is applicable.

REFERENCE SIGNS LIST

10 . . . electromagnetic contactor, 11A . . . first frame, 11B . . . second frame, 12 . . . operating electromagnet, 13 . . . contact mechanism, 21 . . . bottomed square tubular portion, 30 . . . attaching rail, 30a . . . attaching plate portion, 30b and 30c . . . horizontal plate portion, 30d . . . upper flange portion, 30e . . . lower flange portion, 31 . . . rail attachment apparatus, 32 . . . rail mounting concave portion, 33a and 33b . . . nipping portion, 34 . . . slider receiving concave portion, 35 . . . protrusion, 36a and 36b . . . guide plate portion, 38a and 38b . . . engaging portion, 40 . . . slider, 41 . . . main plate portion, 41a . . . engaging portion, 42e . . . elastic engaging projection, 42f and 42f . . . guide piece, 43a and 43b . . . bending elastic portion, 44a and 45a . . . substrate portion, 44b and 45b . . . first U-shaped and folded portion, 44c and 45c . . . parallel plate portion, 44d and 45d . . . second U-shaped and folded portion, and 44e and 45e . . . engaging plate portion.

The invention claimed is:

1. A rail attachment apparatus for an electrical device comprising:
a nipping portion adapted to nip one side edge of an attaching rail attached to an attaching surface of the electrical device; and
a slider made of a synthetic resin material, disposed opposite to the nipping portion in respect to the attaching rail and adapted to be slidably held at another side edge of the attaching rail in a direction intersecting with the attaching rail,
wherein the slider comprises:
a main plate portion that extends in the direction intersecting with the attaching rail and has, at a tip of the main plate portion, an engaging portion adapted to engage the another side edge of the attaching rail,
guide pieces to be guided by guide plate portions formed in the attaching surface, the guide pieces including first guide pieces disposed at one end in a longitudinal direction of the main plate portion and projecting opposite to each other, and second guide pieces disposed at another end in the longitudinal direction of the main plate portion opposite to the one end and projecting opposite to each other, and
bending elastic portions made of the synthetic resin material and formed integrally to the main plate portion, the bending elastic portions projecting from two side edges of the main plate portion to bias the slider in a direction to nip the attaching rail.

2. The rail attachment apparatus for the electrical device according to claim 1, wherein the bending elastic portion comprises a substrate portion that is integrally formed in the main plate portion, and at least one U-shaped and folded portion that is formed on a tip side of the substrate portion and folded back in the form of a U-shape.

3. The rail attachment apparatus for the electrical device according to claim 2, wherein the U-shaped and folded portion comprises a first U-shaped and folded portion that is connected to a free end of the substrate portion, a second U-shaped and folded portion that is folded back on a side of the main plate portion of a plate portion folded back in the first U-shaped and folded portion, and an engaging plate portion that is folded back from the second U-shaped and folded portion and is engageable with an engaging portion formed in the attaching surface.

4. The rail attachment apparatus for the electrical device according to claim 1, wherein the main plate portion has an elastic engaging projection that is formed on an engaging portion side of the main plate portion in the longitudinal direction and obliquely projects and extends toward the attaching surface, and the elastic engaging projection is moved over a protrusion formed in the attaching surface and then engaged with another end portion of the protrusion by sliding the slider when the slider is mounted on the attaching surface.

5. The rail attachment apparatus for the electrical device according to claim 1, wherein the main plate portion has a tool inserting hole in an end portion on a side opposite to the engaging portion, and when a tool is inserted into the tool inserting hole and the slider is slid against a repulsive force of the bending elastic portion, an engaged state of the attaching rail with the engaging portion is releasable.

6. The rail attachment apparatus for the electrical device according to claim 1, wherein the electrical device is configured of an electromagnetic contactor.

7. The rail attachment apparatus for the electrical device according to claim 1, further comprising a slider receiving portion adapted to be attached to the electrical device, and including first guide plate portions spaced apart from each other and located above the attaching surface to form a space for the first guide pieces, and second guide plate portions spaced apart from each other and located above the attaching surface to form another space for the second guide pieces, the second guide plate portions being spaced from the first guide plate portions, and when the slider is disposed in the slider receiving portion, the first and second guide pieces are disposed behind the first and second guide plate portions, respectively so that the bending elastic portions bias the slider toward the attaching rail to engage the attaching rail.

8. The rail attachment apparatus for the electrical device according to claim 7, wherein the slider further includes an opening, and an elastic engaging projection located in the opening to project therefrom, the elastic engaging projection restricting movement of the slider.

9. The rail attachment apparatus for the electrical device according to claim 8, wherein the slider receiving portion further includes engaging portions directly engaging the bending elastic portions to bias the slider.

* * * * *